(12) United States Patent
Mizumura et al.

(10) Patent No.: US 10,533,246 B2
(45) Date of Patent: Jan. 14, 2020

(54) DEPOSITION MASK, METHOD FOR MANUFACTURING THE SAME, AND TOUCH PANEL

(71) Applicant: V TECHNOLOGY CO., LTD., Yokohama-shi, Kanagawa (JP)

(72) Inventors: Michinobu Mizumura, Yokohama (JP); Shuji Kudo, Yokohama (JP); Koichi Kajiyama, Yokohama (JP)

(73) Assignee: V TECHNOLOGY CO., LTD., Yokohama-shi (JP)

( * ) Notice: Subject to any disclaimer, the term of this patent is extended or adjusted under 35 U.S.C. 154(b) by 93 days.

(21) Appl. No.: 15/359,527

(22) Filed: Nov. 22, 2016

(65) Prior Publication Data

US 2017/0130321 A1    May 11, 2017

Related U.S. Application Data

(63) Continuation of application No. PCT/JP2015/068514, filed on Jun. 26, 2015.

(30) Foreign Application Priority Data

Jul. 8, 2014    (JP) .................................. 2014-140709

(51) Int. Cl.
*C23C 14/04* (2006.01)
*C23C 14/08* (2006.01)
(Continued)

(52) U.S. Cl.
CPC .......... *C23C 14/042* (2013.01); *C23C 14/086* (2013.01); *C23C 14/34* (2013.01);
(Continued)

(58) Field of Classification Search
None
See application file for complete search history.

(56) References Cited

U.S. PATENT DOCUMENTS

| 3,206,322 A | * | 9/1965 | Morgan ................ C23C 14/042 118/504 |
| 2012/0147472 A1 | | 6/2012 | Kajiya et al. |
| 2012/0329188 A1 | * | 12/2012 | Sonoda ................ C23C 14/042 438/34 |

FOREIGN PATENT DOCUMENTS

| CN | 100999811 A | 7/2007 |
| CN | 101139698 A | 3/2008 |

(Continued)

OTHER PUBLICATIONS

Chinese Office Action from Chinese Patent Application No. 201580036959.3, dated Jul. 19, 2018, 15 pages.

(Continued)

*Primary Examiner* — Jethro M. Pence
(74) *Attorney, Agent, or Firm* — Morgan, Lewis & Bockius LLP

(57) ABSTRACT

The present invention provides a deposition mask including: a mask layer having an aperture pattern that is formed in conformity with a transparent electrode to be formed on a display surface of a display panel, with the same shape and size as the transparent electrode; and a support layer having plural support lines formed on one surface of the mask layer across the aperture pattern. In the mask, an arrangement pitch for the support lines of the support layer is set so as to reduce moire fringes or diffraction fringes that appear due to shadows of the support lines, which are transferred onto the transparent electrode as unevenness in deposition thickness.

10 Claims, 13 Drawing Sheets

(51) Int. Cl.
*C23C 14/34* (2006.01)
*C25D 3/12* (2006.01)
*C25D 5/02* (2006.01)
*C25D 5/14* (2006.01)
*G06F 3/041* (2006.01)

(52) U.S. Cl.
CPC ............... *C25D 3/12* (2013.01); *C25D 5/022* (2013.01); *C25D 5/14* (2013.01); *G06F 3/041* (2013.01); *G06F 2203/04103* (2013.01)

(56) References Cited

FOREIGN PATENT DOCUMENTS

| | | |
|---|---|---|
| CN | 101833246 A | 9/2010 |
| CN | 102203639 A | 9/2011 |
| CN | 103207518 A | 7/2013 |
| CN | 103268057 A | 8/2013 |
| JP | 10-330910 A | 12/1998 |
| JP | H 10-330911 A | 12/1998 |
| JP | 11-214154 A | 8/1999 |
| JP | 2004-318899 A | 11/2004 |
| JP | 2008-282603 A | 11/2008 |
| JP | 2011-154338 A | 8/2011 |

OTHER PUBLICATIONS

Japanese Office Action from Japanese Patent Application No. 2014-140709, dated Aug. 1, 2017.
International Preliminary Report on Patentability dated Jan. 19, 2017, which issued in International Application No. PCT/JP2015/068514.
Chinese Office Action from Chinese Patent Application No. 201580036959.3 dated Mar. 28, 2019, 7 pages including English language translation.

* cited by examiner

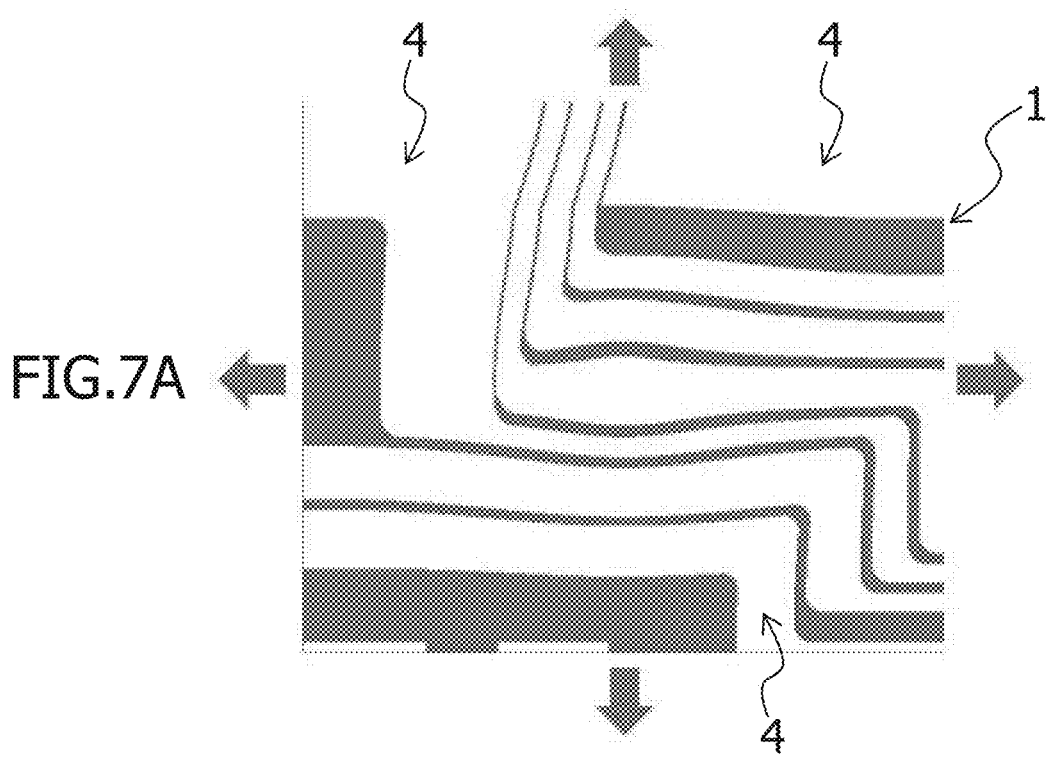
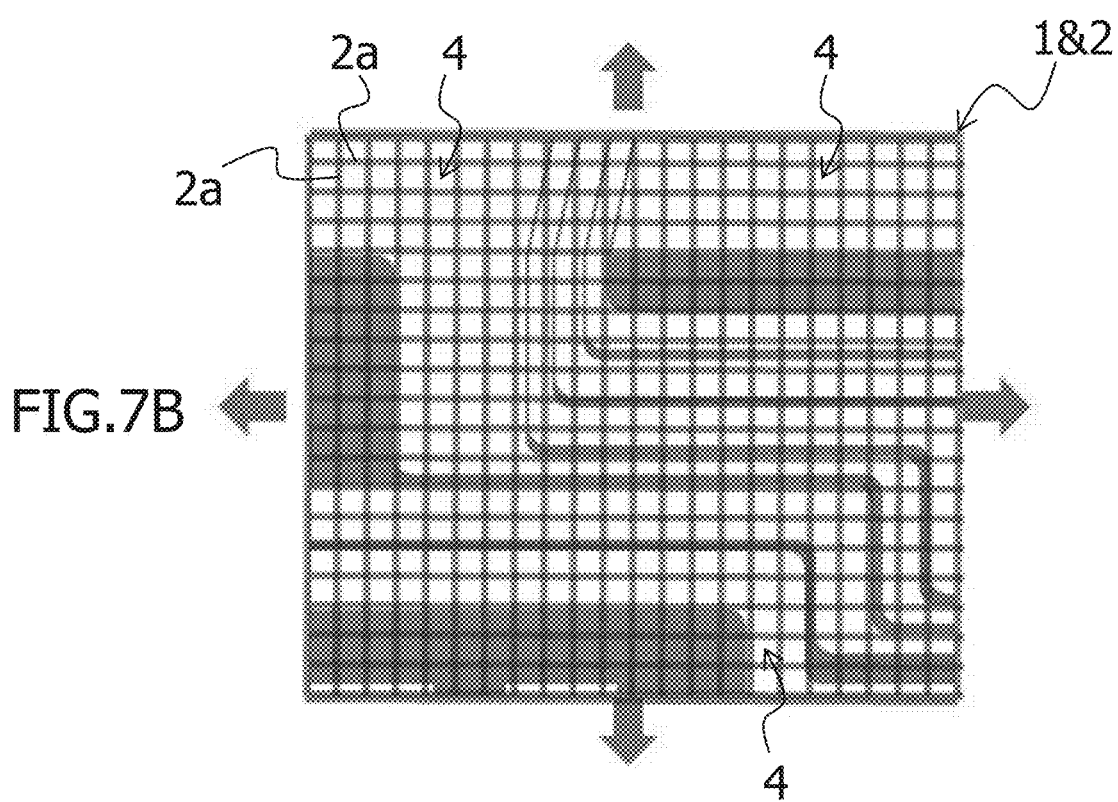

DEPOSITION MASK, METHOD FOR MANUFACTURING THE SAME, AND TOUCH PANEL

CROSS-REFERENCE TO RELATED APPLICATION

This application is a continuation application of PCT/JP2015/068514, filed on Jun. 26, 2015.

BACKGROUND OF THE INVENTION

1. Field of the Invention

The present invention relates to a deposition mask for forming a layer by deposition on a substrate to obtain a thin film pattern and more particularly to a deposition mask that can improve the display quality of a display device equipped with a touch panel and to a method for manufacturing the same and a touch panel that is prepared using the same.

2. Description of Related Art

In conventional deposition masks of this type, a masking portion has at least one aperture and reinforcement lines are connected across the aperture at one surface of the masking portion. There is a gap between the other surface of the masking portion and the reinforcement lines (refer to, for example, JP H10-330910 A).

As regards the reinforcement lines of such conventional deposition masks, however, plural thin lines are merely arranged in parallel or in a mesh form across the aperture without considering the arrangement pitch between the reinforcement lines. Therefore, if such deposition mask is used in forming a thin film pattern to obtain, for example, a transparent electrode of a touch panel, moire fringes or diffraction fringes may possibly appear due to shadows of the reinforcement lines, which are transferred onto the surface of the transparent electrode as unevenness in deposition thickness. This is likely to deteriorate the display quality of a display device equipped with such touch panel.

SUMMARY OF THE INVENTION

In view of some of the above problems, an object of the present invention is to provide a deposition mask that can improve the display quality of a display device equipped with a touch panel, a method for manufacturing the same, and a touch panel that is prepared using the same.

In order to attain the above object, the present invention provides a deposition mask including: a mask layer having an aperture pattern that is formed in conformity with a thin film pattern to be formed on a substrate, with the same shape and size as the thin film pattern; and a support layer having a plurality of thin lines formed on one surface of the mask layer across the aperture pattern, in which an arrangement pitch for the thin lines of the support layer is set so as to reduce moire fringes or diffraction fringes that appear due to shadows of the thin lines, which are transferred onto the thin film pattern as unevenness in deposition thickness.

Moreover, the present invention provides a method for manufacturing a deposition mask including: a first step of forming, by electroplating, a magnetic metal mask layer on a metal base member, which has an aperture pattern that is formed in conformity with a thin film pattern to be formed on a substrate with the same shape and size as the thin film pattern; and a second step of forming, by electroplating, a magnetic metal support layer with a plurality of thin lines extending across the aperture pattern, on one surface of the mask layer, in which in the second step, the thin lines of the support layer are formed at such arrangement pitch as to reduce moire fringes or diffraction fringes that appear due to shadows of the thin lines, which are transferred onto the thin film pattern as unevenness in deposition thickness.

Furthermore, the present invention provides a touch panel including a transparent electrode that is prepared using a deposition mask including: a mask layer having an aperture pattern of the same shape and size as the transparent electrode to be formed; and a support layer having a plurality of thin lines formed on one surface of the mask layer across the aperture pattern, the transparent electrode being formed from the support layer side, on a display surface of a display element, in which an arrangement pitch for the thin lines is set so as to reduce moire fringes or diffraction fringes that appear due to shadows of the thin lines, which are transferred onto the transparent electrode as unevenness in deposition thickness.

According to the deposition mask of the present invention, it is possible to reduce moire fringes or diffraction fringes that appear due to the shadows of the thin lines of the support layer, which are transferred onto the thin film pattern as unevenness in deposition thickness. Therefore, also when a transparent electrode for a touch panel is prepared using the deposition mask of the present invention, no moire fringes or diffraction fringes appear on a display screen, hereby improving the display quality of a display device.

BRIEF DESCRIPTION OF THE DRAWINGS

FIGS. 1A to 1D show a deposition mask according to an embodiment of the present invention, in which FIG. 1A is a plan view thereof, FIG. 1B is a cross-sectional view taken along the center line of FIG. 1A, FIG. 1C is an enlarged plan view of a main part thereof, and FIG. 1D is a cross-sectional view taken along line A-A as viewed from arrows of FIG. 1C.

FIGS. 3A and 3B show an experimental result indicating how shadows of support lines change depending on the gap distance between a support layer and a display panel according to the embodiment, in which FIG. 3A shows shadows cast by the support lines and FIG. 3B is a cross-sectional view showing a change of gap distance between the support layer and the display panel.

FIGS. 4A and 4B show an experimental result indicating shadows cast by the support lines at a large gap between the support layer and the display panel according to the embodiment, in which FIG. 4A shows shadows cast by the support lines and FIG. 4B is a cross-sectional view illustrating a gap that is defined between the support layer and the display panel with the distance corresponding to the mask layer thickness.

FIGS. 5A and 5B are explanatory views showing how to arrange support lines relative to the array directions of pixel patterns, in which FIG. 5A shows an example in which plural support lines run in parallel, crossing the array directions of pixel patterns at 90°, and FIG. 5B shows an example in which plural support lines extend in a mesh form, crossing the array directions of pixel patterns at 45°.

FIGS. 7A and 7B are plan views illustrating advantageous effects of the support lines of the support layer, in which FIG. 7A shows an example in which no support layer is formed and FIG. 7B shows an example in which a support layer is formed.

FIGS. 9A and 9B show another structural example of the support lines of the support layer according to the embodiment, in which FIG. 9A shows shadows cast by the support lines and FIG. 9B is a corresponding cross-sectional view of the support layer in FIG. 9A.

DESCRIPTION

Figure 1A:
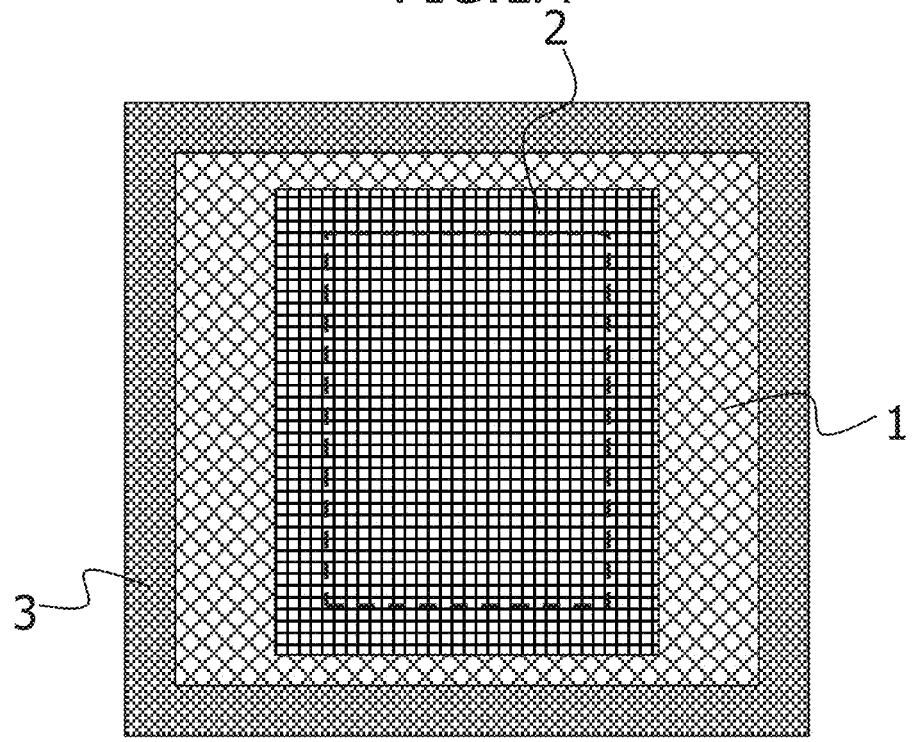
Figure 1B:
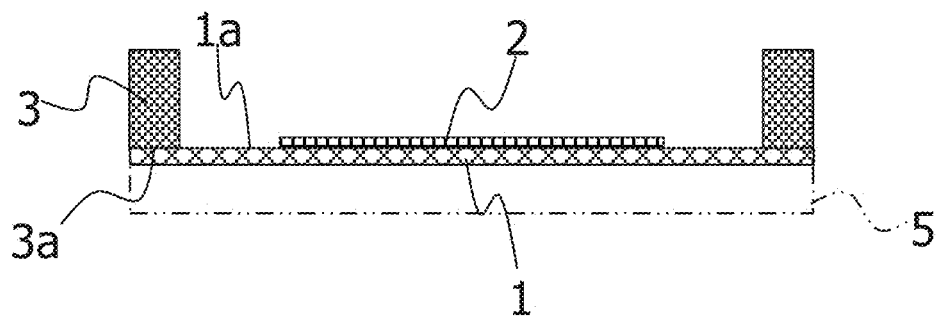
Figure 1C:
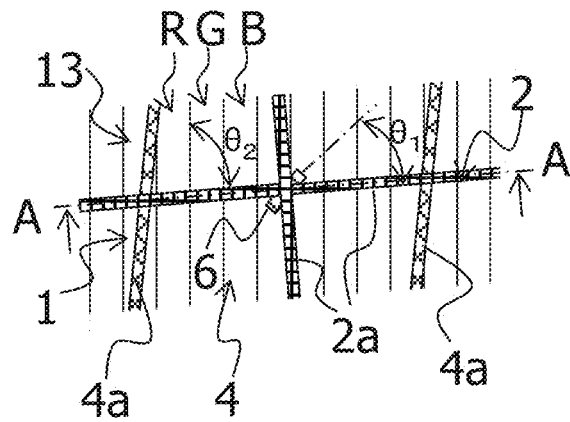
Figure 1D:
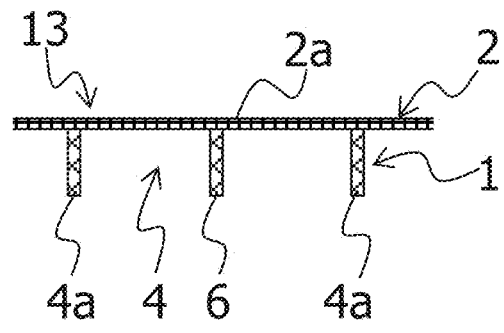

Hereinafter, embodiments of the present invention will be described in detail with reference to the accompanying drawings. FIGS. 1A to 1D show a deposition mask according to an embodiment of the present invention, in which FIG. 1A is a plan view thereof, FIG. 1B is a cross-sectional view taken along the center line of FIG. 1A, FIG. 1C is an enlarged plan view showing a main part thereof, and FIG. 1D is a cross-sectional view taken along line A-A as viewed from arrows of FIG. 1C. The deposition mask is used in forming a deposition layer on a substrate to obtain a thin film pattern. The mask includes a mask layer 1, a support layer 2, and a frame 3. Described here is an example in which the substrate corresponds to a display panel 5 of a display device and the thin film pattern corresponds to a transparent electrode of a touch panel.

The mask layer 1 has aperture patterns 4 of the same shape and size as transparent electrodes (thin film patterns) to be formed on the surface of the display panel. The aperture patterns are formed in conformity with the thin film patterns. The mask layer 1 is made of, for example, a magnetic metal material such as nickel, a nickel alloy, invar, or an invar alloy.

Figure 2:
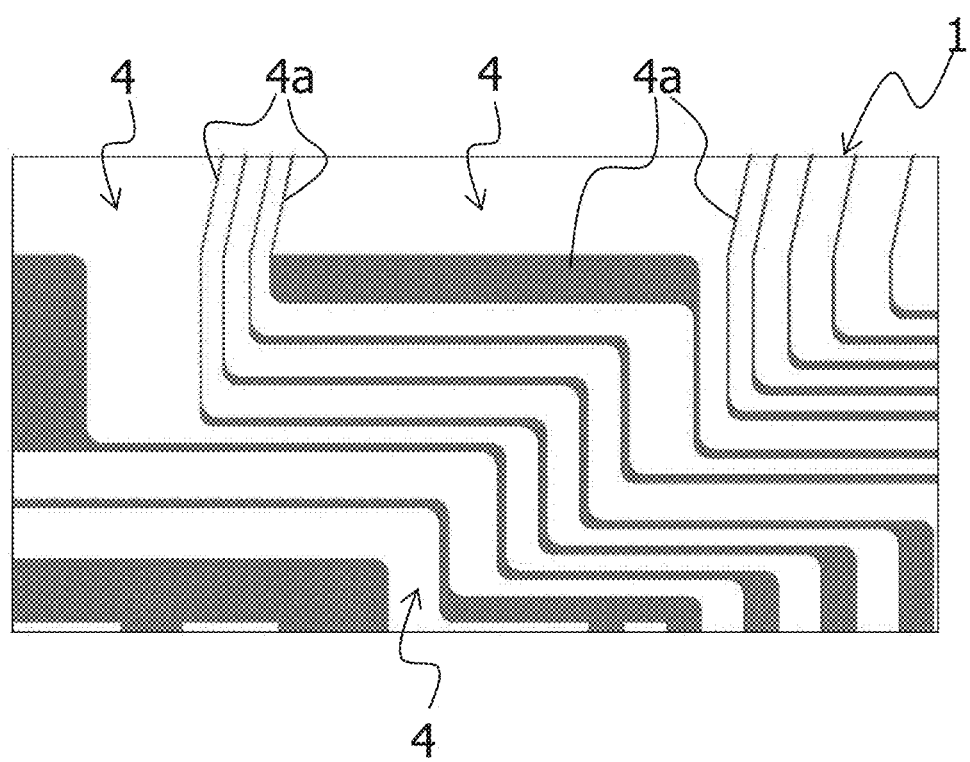
FIG. 2 is a partially enlarged plan view of a mask layer according to the embodiment.

FIG. 2 is a partially enlarged plan view of the mask layer 1. In FIG. 2, outlined portions indicate the aperture patterns 4 corresponding to the transparent electrodes. Ribs 4a are defined between adjacent aperture patterns 4 with the width of about 10 μm minimum. To be specific, in each aperture pattern 4, an aperture portion having a wide plane area corresponds to an electrode portion of the touch panel, and an elongated aperture portion extending from the electrode portion corresponds to an interconnect line to be connected to a control unit (not shown).

The thickness of the mask layer 1 influences the density of a shadow cast by a thin line (hereinafter referred to as "support line 2a") of the support layer 2 as described later on the surface of the transparent electrode, as well as a sheet resistance of the transparent electrode. The support line 2a makes a shadow on a transparent conductive film underneath itself, and the shadowed portion has the smaller thickness than the rest. Accordingly, if the transparent conductive film has large differences of thickness between the portion underneath the support line 2a and the rest, the shadow of the support line 2a becomes thick and distinct. In conjunction with the above, a sheet resistance value of the transparent electrode increases. On the other hand, if there are small differences of thickness, the shadow of the support line 2a becomes blurred and thin. Along with the above, the sheet resistance value of the transparent electrode decreases.

More specifically, if the mask layer 1 is thin, a gap between each support line 2a and the display surface of the display panel 5 reduces and thus, a small amount of deposition substances can reach below the support lines 2a and adhere to the display surface. As a result, the transparent conductive film has large differences of thickness between the portion below each support line 2a and the rest, and the support line 2a makes a thick and distinct shadow on the surface of the transparent electrode. Thus, moire fringes are more likely to appear due to the shadows of the support lines 2a and also, the sheet resistance value of the transparent electrode increases.

Figure 3A:
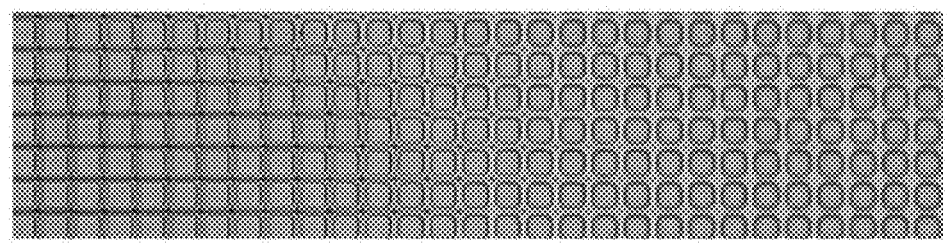
Figure 3B:
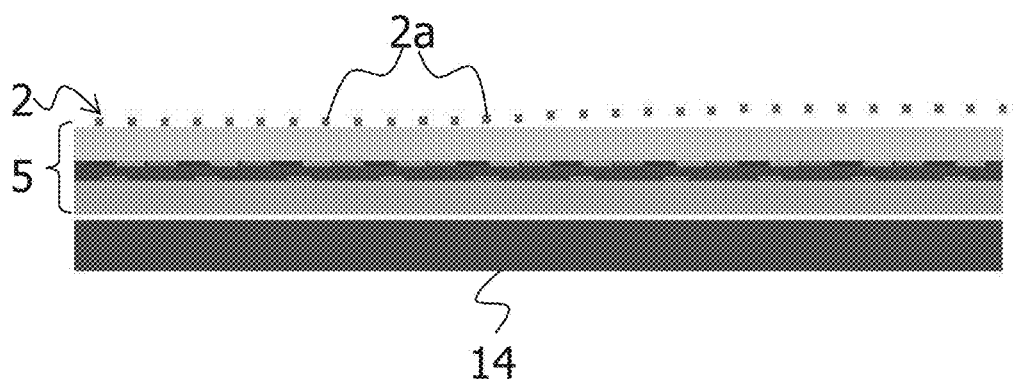

FIGS. 3A and 3B show an experimental result indicating how the shadows of the support lines 2a change depending on the gap distance between the support layer 2 and the display surface of the display panel 5. On the left side of FIGS. 3A and 3B, the support layer 2 is attracted to a magnet 14 disposed on the back of the display panel 5 and thus closely attached to the display surface of the display panel 5. Being closer to the right end thereof, a gap increases between the support layer 2 and the display surface of the display panel 5. At the right end, the gap reaches about 10 μm (see FIG. 3B). As apparent from FIG. 3A, the shadow of the support line 2a becomes distinct nearer the left end, whereas it is blurred nearer the right end at which the support layer 2 and the display surface of the display panel 5 have a large gap.

Figure 4A:
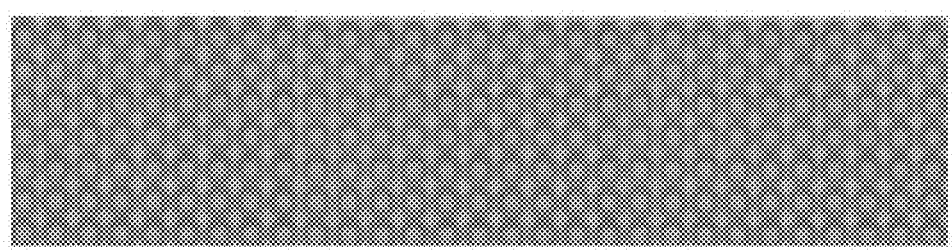
Figure 4B:
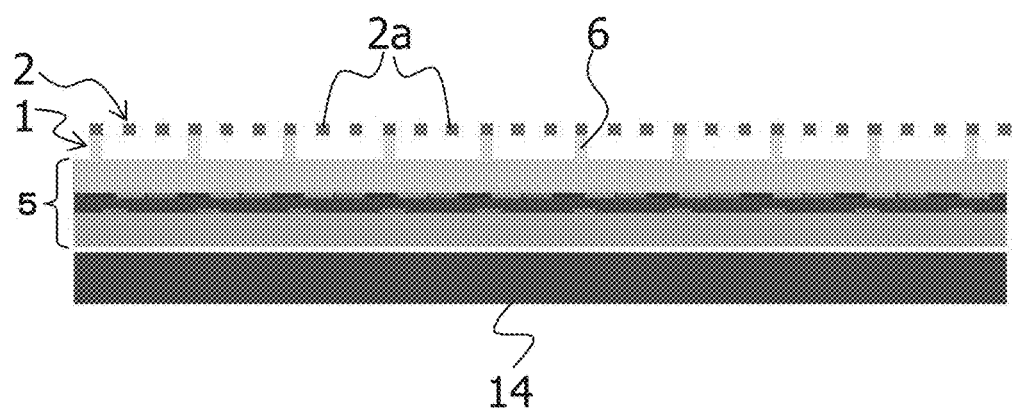

In contrast, as shown in FIG. 4B, if the mask layer 1 is thick, a gap increases between each support line 2a and the display surface of the display panel 5, and a large amount of deposition substances can reach below the support lines 2a and adhere to the display surface of the display panel 5. As a result, the transparent conductive film has small differences of thickness between the portion below each support line 2a and the rest. As shown in FIG. 4A, the support line 2a makes a blurred and thin shadow on the surface of the transparent electrode. Accordingly, it is possible to suppress moire fringes that appear due to the shadows of the support lines 2a. The sheet resistance value of the transparent electrode is reduced as well. FIGS. 4A and 4B show an experimental result indicating shadows cast by the support lines 2a under the condition that the thickness of the mask layer 1 (gap between the support layer 2 and the display surface of the display panel 5) is about 40 μm.

In general, a requisite sheet resistance value of, for example, indium tin oxide (ITO) transparent electrode of the touch panel is 40 Ω/sq. or less, and the thickness of the mask layer 1 is appropriately determined by experiment. In this embodiment, the thickness of the mask layer 1 is set to about 40 μm.

The mask layer 1 includes spacers 6 disposed inside the aperture patterns 4 and configured to support the support lines 2a of the support layer 2 from below (see FIGS. 1C and 1D). Each spacer 6 has the same thickness (about 40 μm) as the mask layer 1 and has an elongated strip shape in cross section, which approximately measures 10 μm×30 μm. The spacer runs with its longitudinal axis crossing the support line 2a of the support layer 2 (see FIG. 1C). With such arrangement, high positioning accuracy is not required in positioning the support line 2a of the support layer 2 relative to the spacer 6.

In addition, the intersecting angle $\theta_1$ between the support line 2a and the spacer 6 desirably satisfies the condition of $0°<\theta_1<180°$. If the spacer 6 is provided such that its longitudinal axis coincides with the direction in which the support line 2a extends, there is a possibility that, when the deposition mask is attracted to the magnet 14 and closely attached to the display panel 5, the support line 2a is distorted to tilt the spacer 6. In this case, the support line 2a gets closer to the display panel 5, whereby the support line 2a may possibly make a thick shadow. On the other hand, if the spacer 6 is provided such that its longitudinal axis intersects the support line 2a at the angle $\theta_1$, the spacer 6 is hardly tilted even though the support line 2a is distorted. Accordingly, the support line 2a does not approach the display panel 5, and the shadow of the support line 2a is restrained. In this embodiment, the angle $\theta_1$ is 45°.

On one surface 1a of the mask layer 1, the support layer 2 is formed over a region for forming the aperture pattern 4 as enclosed by dashed line of FIG. 1A. The support layer 2 serves to keep the shape of the aperture pattern 4 and includes plural support lines 2a formed across the aperture patterns 4. The support layer 2 is made of, for example, a magnetic metal material such as nickel, a nickel alloy, invar, or an invar alloy. In this case, the arrangement pitch for the support lines 2a is desirably set so as to suppress moire fringes or diffraction fringes that appear due to shadows of the support lines 2a, which are transferred onto the transparent electrode as unevenness in thickness of the transparent conductive film formed on the display surface of the display panel 5.

Figure 5A:
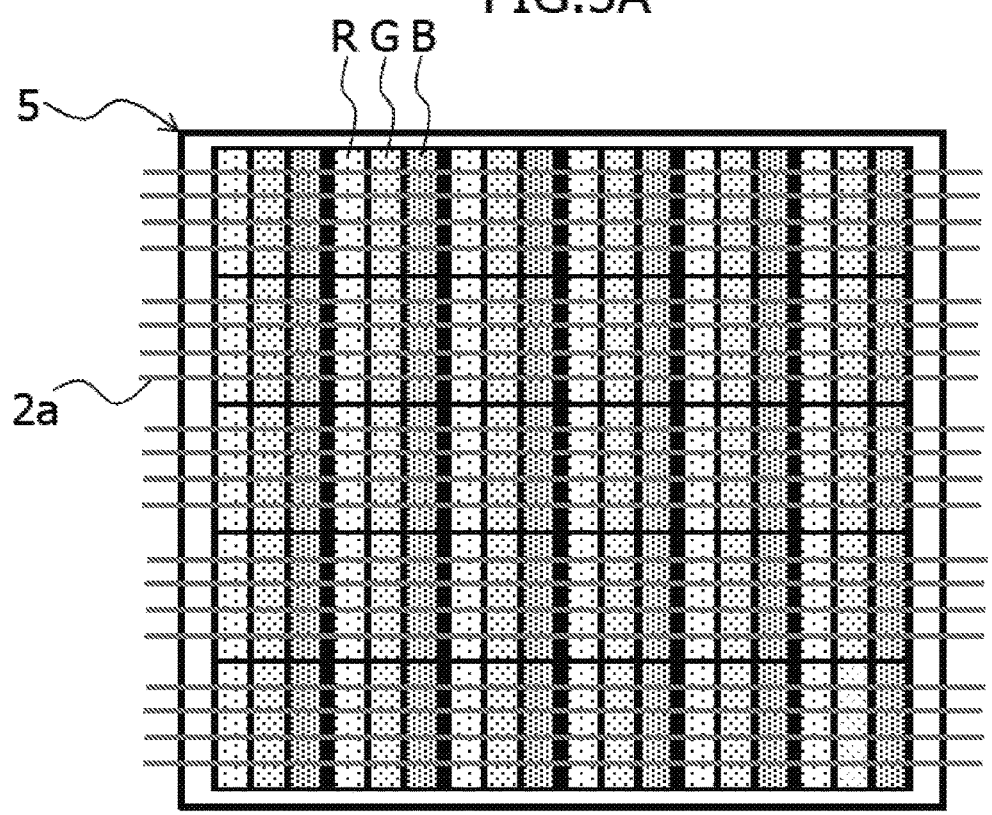
Figure 5B:
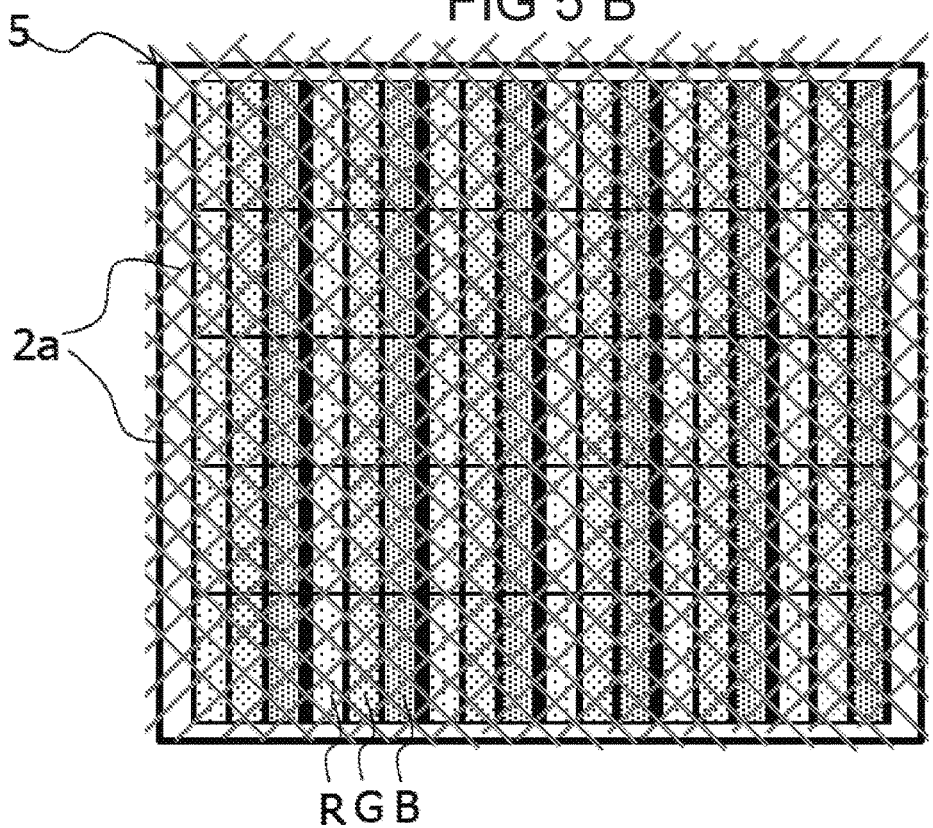

In addition, as shown in FIG. 1C, it is more desirable to arrange the support lines 2a so as to intersect, at an angle $\theta_2$, the array directions of plural rectangular pixel patterns R, G, and B that are formed in line on the display panel 5 being aligned with the mask layer 1. At this time, the intersecting angle $\theta_2$ is larger than 0 degrees and smaller than 180 degrees ($0°<\theta_2<180°$). FIGS. 5A and 5B are explanatory views showing how to arrange the support lines 2a relative to the array directions of the pixel patterns R, G, and B. For the sake of simple illustration, the mask layer 1 is omitted here. FIG. 5A shows an example in which the plural support lines 2a extend in parallel and interest the array directions of the pixel patterns R, G, and B at 90°. FIG. 5B shows an example in which the plural support lines 2a cross each other in a mesh form and interest the array directions of the pixel patterns R, G, and B at 45°. This arrangement suppresses interferences between pixels and the shadows of the support lines 2a, which are transferred onto the transparent electrode of the display panel 5, and thus reduces moire fringes.

Figure 6:
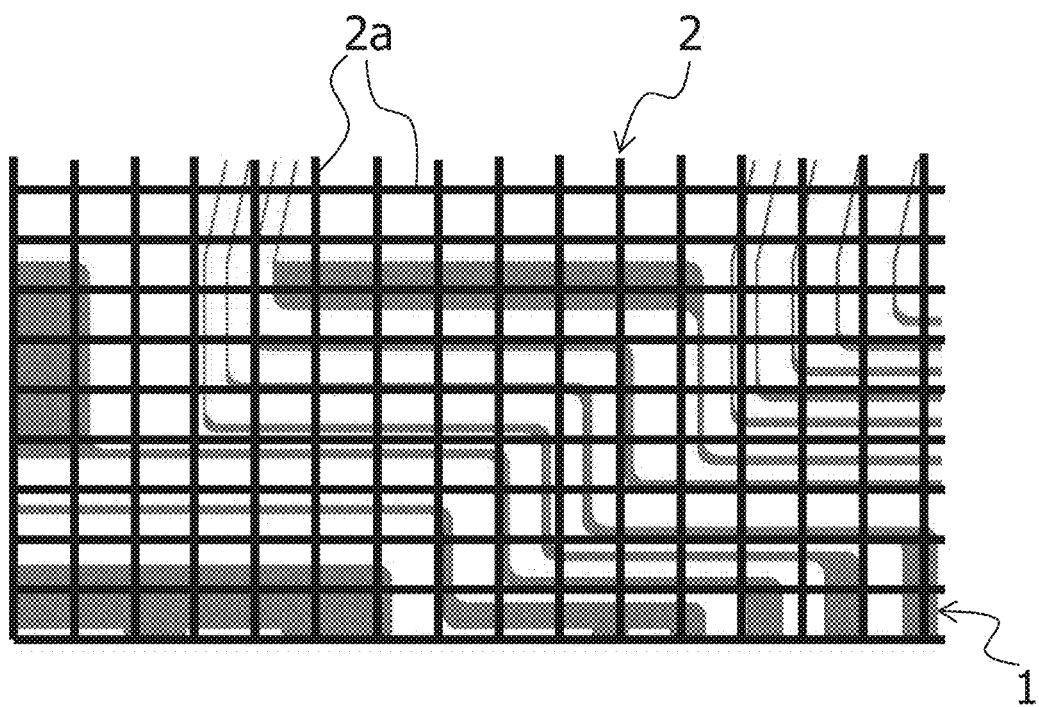
FIG. 6 is a plan view showing one structural example of support lines of the support layer according to the embodiment.

FIG. 6 is a plan view showing one structural example of the support lines 2a of the support layer 2. In the structural example of FIG. 6, the support layer 2 has a mesh-like structure of plural crisscrossing support lines 2a. The deposition mask of FIG. 7A dispenses with any support line 2a and thus has a possibility that, upon stretching and holding the mask layer 1 over the frame 3 described later as indicated by arrows of FIG. 7A, the aperture patterns 4 may possibly deform. In contrast to such mask, according to the present invention, the mesh-like support lines 2a are arranged across the aperture patterns 4, whereby even when a tension acts on the mask layer 1 and the support layer 2 as indicated by arrows of FIG. 7B, the aperture pattern 4 is kept in the original shape.

Figure 8:
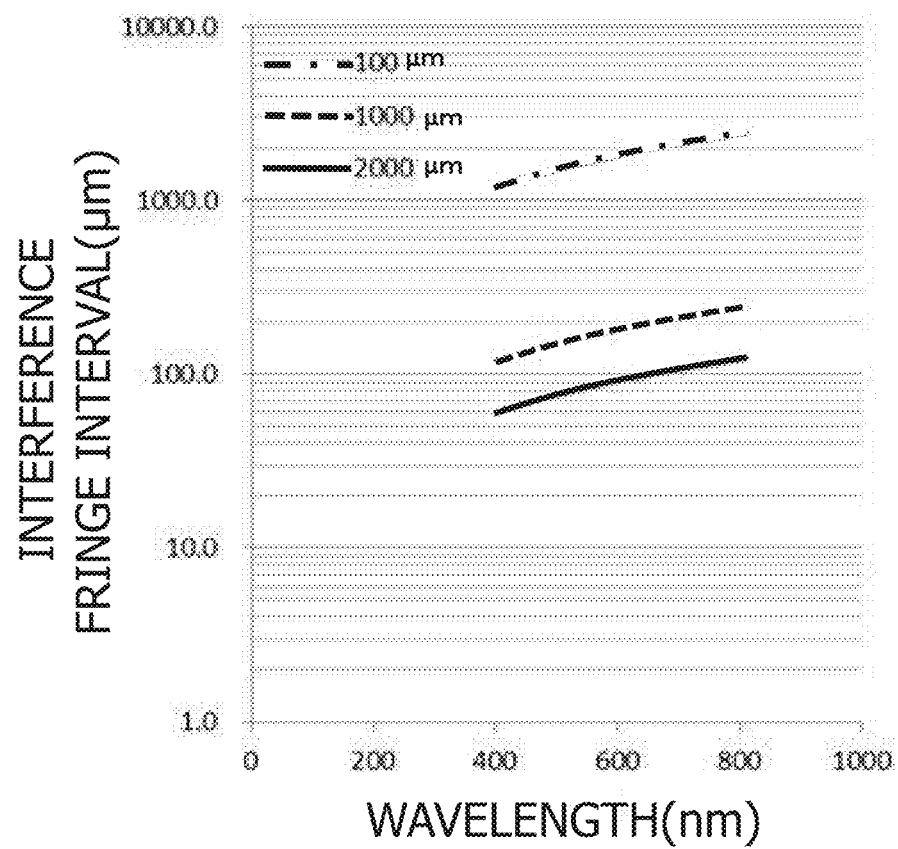
FIG. 8 is a graph showing the relationship between the wavelength of visible light and an interval between resultant interference fringes, using as a parameter the arrangement pitch for the support lines.

FIG. 8 is a graph showing the relationship between the wavelength of visible light that can pass through the display surface of the display panel 5 and an interval between resultant interference fringes, using as a parameter arrangement pitch for the support lines 2a. In general, it is difficult to visually observe interference fringes formed at the interval of about 100 µm or more and 200 µm or less. As could be apparent from FIG. 8, the arrangement pitch for the support lines 2a is desirably set to 1 mm or more.

Figure 9A:
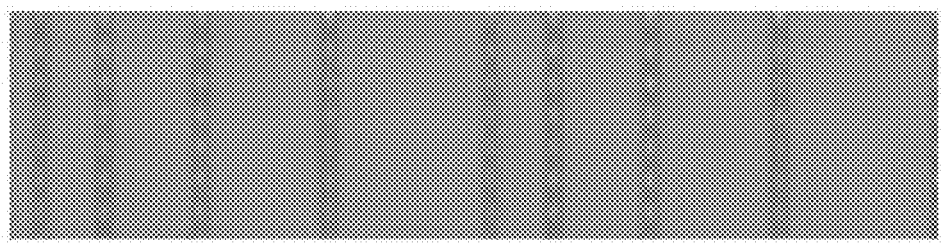
Figure 9B:
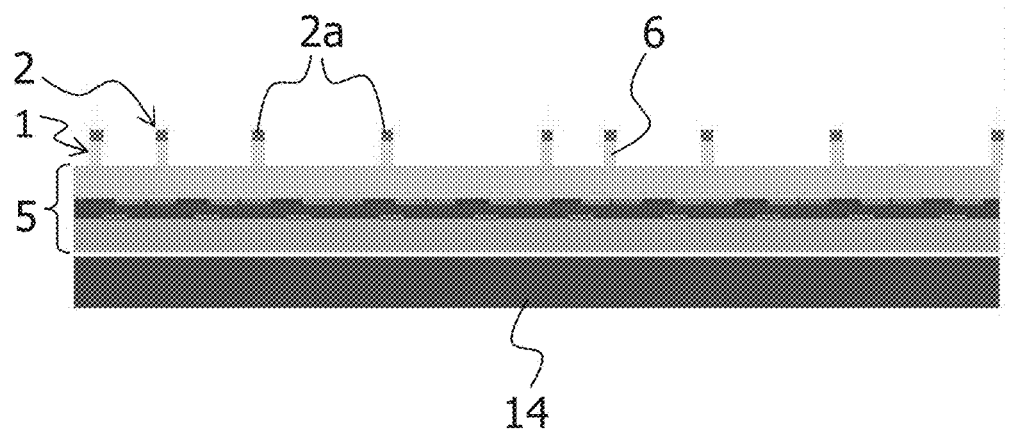

Note that the support layer 2 is not limited to the one having the support lines 2a arranged in a mesh form as shown in FIG. 6 and can be the one in which the support lines 2a run at the one surface 1a of the mask layer 1 in one direction within a two-dimensional plane. In this case, as shown in FIG. 9B, it is possible to define a set of plural support lines 2a extending at different intervals and arrange plural sets at a predetermined arrangement pitch (for example, large interval such as about 2 mm to 3 mm). This arrangement can also reduce moire fringes or diffraction fringes that appear due to the shadows of the support lines 2a as shown in FIG. 9A.

Figure 10:
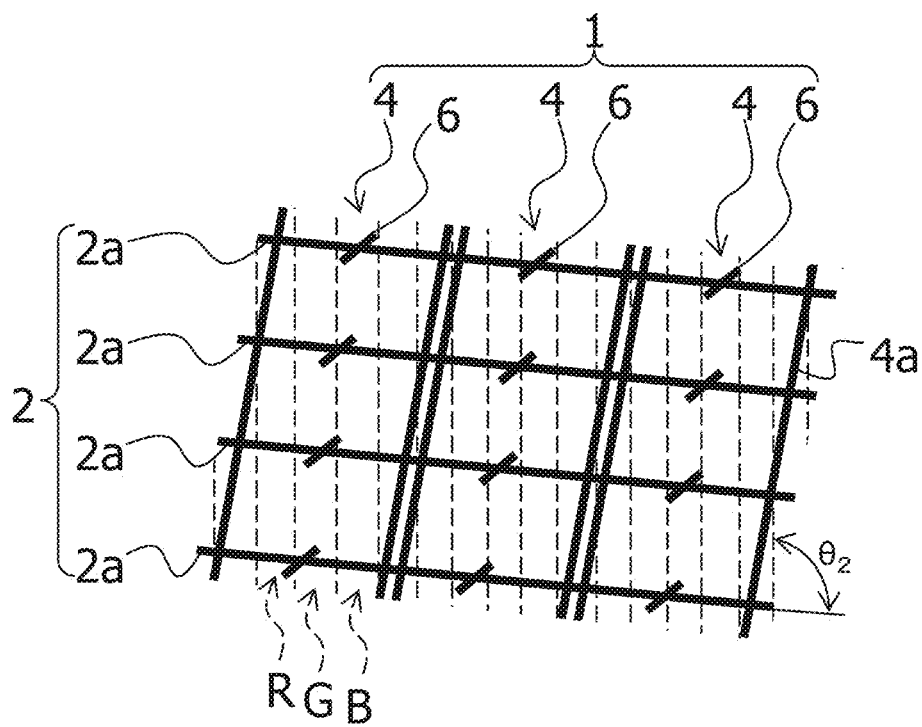
FIG. 10 is a plan view showing still another structural example of the support lines of the support layer according to the embodiment.

Moreover, if the aperture patterns 4 of the mask layer are formed in conformity with transparent electrodes designed such that edge portions (ribs 4a) of the aperture patterns 4 extend not in parallel but oblique at a predetermined intersecting angle to color filters that are formed in stripes along the array directions of pixel patterns in different colors, i.e., the pixel patterns R, G, and B as shown in FIG. 10, the support layer 2 may have plural support lines 2a arranged in parallel to each other across the color filters formed in stripes (corresponding to the respective array directions of pixel patterns R, G, and B) at an angle $\theta_2$ ($0°<\theta_2<180°$). This arrangement reduces moire fringes that appear between the color filters and the transparent electrodes and also reduces moire fringes or diffraction fringes between the color filters and the shadows of the support lines 2a. In this case, moire fringes can be also reduced even if the arrangement pitch for the support lines 2a is reduced down to about 500 µm.

The frame 3 is provided on the one surface 1a of the mask layer 1. The frame 3 holds the mask layer 1 stretched out in parallel to the surface and has an aperture enough to enclose the support layer 2. The frame is made of a magnetic metal material such as invar or an invar alloy. An end surface 3a thereof is connected by spot welding to the periphery of the one surface 1a of the mask layer 1.

Next, a method for manufacturing the thus-structured deposition mask is described. The deposition mask of the present invention is manufactured through a procedure including: a first step of forming, by electroplating, the magnetic metal mask layer 1 with the aperture patterns 4 on a metal base member, the aperture patterns being formed in conformity with the transparent electrodes to be formed on the display surface of the display panel 5, with the same shape and size as the transparent electrodes; a second step of forming, by electroplating, the magnetic metal support layer 2 with the plural support lines 2a on the one surface 1a of the mask layer 1, the support lines being arranged across the aperture patterns 4; and a third step of connecting the periphery of the one surface 1a of the mask layer 1 with the frame 3. The respective steps are described in detail herebelow.

Figure 11A:
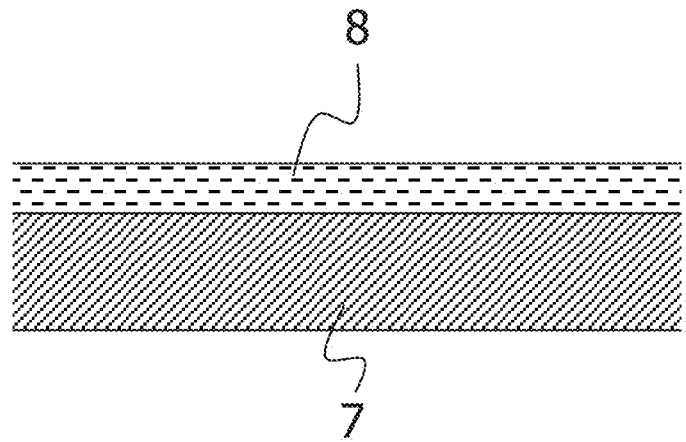
FIGS. 11A to 11C are an explanatory view showing a step of forming a mask layer in a manufacturing method for a deposition mask according to the present invention.
Figure 11B:
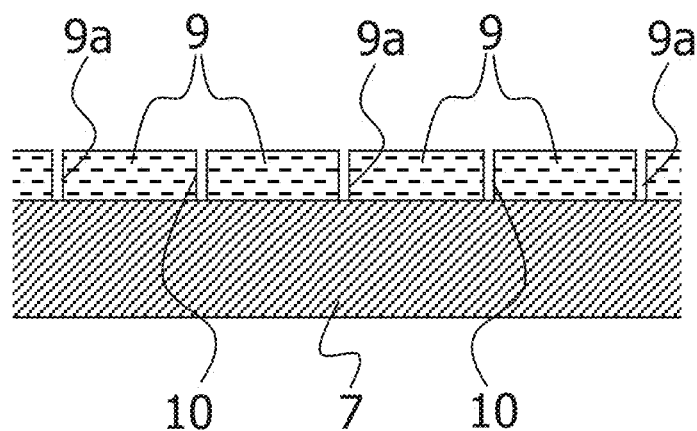
Figure 11C:
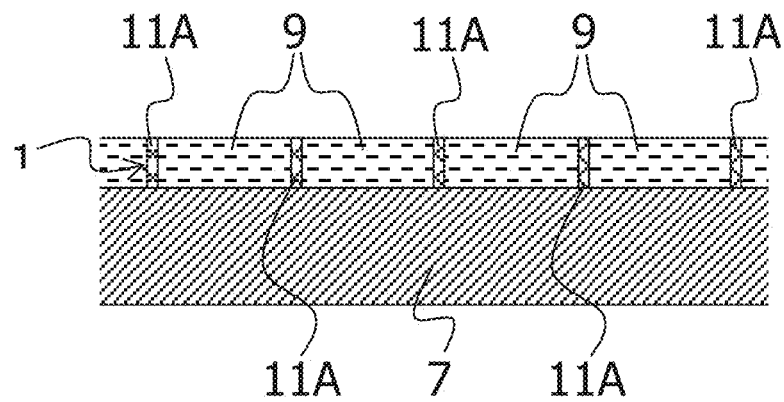

FIGS. 11A to 11C are explanatory views illustrating the first step, or a step of forming a mask layer. First, as shown in FIG. 11A, a photoresist 8 is applied onto a flat surface of a metal base member 7. At this time, the photoresist 8 is applied with substantially the same thickness as the intended mask layer 1, i.e., about 40 µm.

Next, as shown in FIG. 11B, the photoresist 8 is exposed and developed using a photomask to thereby form island patterns 9 in conformity with the intended aperture patterns 4 with the same shape and size as the aperture patterns. Concurrently, grooves 10 are formed in conformity with the intended spacers 6 with the same shape and size as the spacers such that the grooves perforate the island patterns 9 and reach the surface of the metal base member 7. As alignment marks for positional alignment with the display panel 5, island patterns can be formed in predetermined positions other than regions for forming aperture patterns.

Subsequently, the metal base member 7 is immersed into a plating bath with a magnetic metal material such as nickel. As shown in FIG. 11C, a magnetic metal material 11A is applied by electroplating with the thickness of about 40 μm on an outer surface 9a of each island pattern 9 and the exposed surface of the metal base member 7 within each groove 10. As a result, the mask layer 1 is formed on the metal base member 7.

Figure 12A:
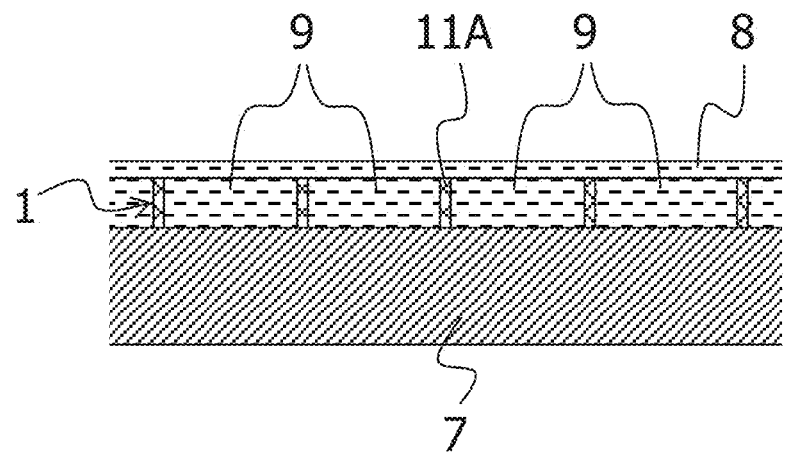
FIGS. 12A to 12C are an explanatory view showing a step of forming a support layer in the manufacturing method for a deposition mask according to the present invention.
Figure 12B:
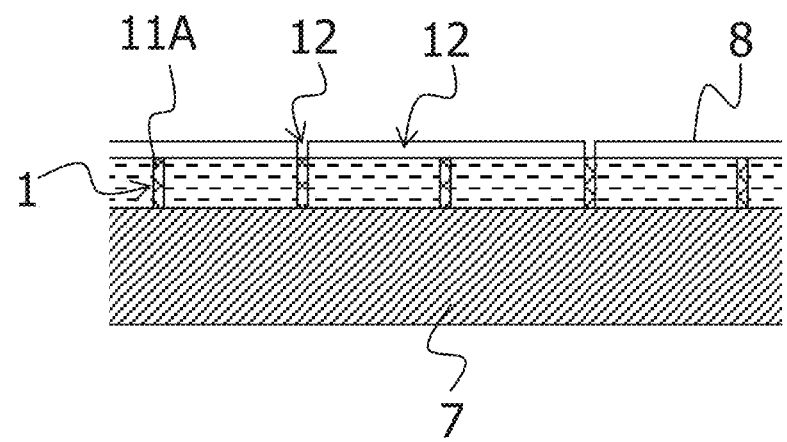
Figure 12C:
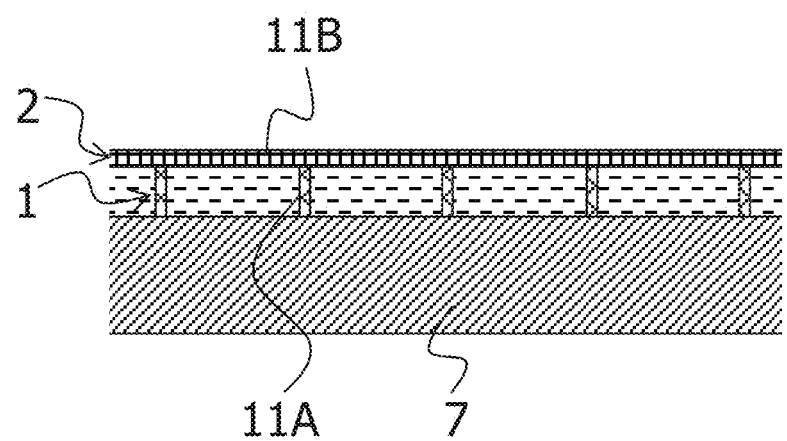

FIGS. 12A to 12C are explanatory views illustrating the second step, or a step of forming a support layer. First, as shown in FIG. 12A, the photoresist 8 is applied onto the mask layer 1 formed on the metal base member 7. At this time, the photoresist 8 is applied with substantially the same thickness as the intended support layer 2, i.e., about 10 μm.

Next, as shown in FIG. 12B, the photoresist 8 is exposed and developed using the photomask to excavate, down to the mask layer 1, the grooves 12 in conformity with, for example, the crisscrossing support lines 2a as shown in FIG. 1C with the same shape and size as the support lines. FIG. 12B is a cross-sectional view taken along the center line of the groove 12 that laterally extends in conformity with the support line 2a.

Next, the metal base member 7 is immersed into a plating bath with a magnetic metal material such as nickel. As shown in FIG. 12C, a magnetic metal material 11B for the support layer 2 is applied by electroplating with thickness of about 10 μm on the exposed surface (corresponding to the upper surface of the rib 4a between the aperture patterns 4 and the upper surface of the spacer 6) of the magnetic metal material 11A of the mask layer 1 within the groove 12. As a result, the mask layer 1 and the support layer 2 are formed on the metal base member 7 by two-step electroplating processes.

After that, the metal base member 7 is cleaned in a solvent or stripper solution for the photoresist 8 to thereby dissolve and remove the photoresist 8. Moreover, the mask layer 1 and the support layer 2 are stripped off together from the metal base member 7. In this way, a mask sheet 13 is prepared as shown in FIGS. 1C and 1D, as a combination of the mask layer 1 having the aperture patterns 4 and the spacers 6, and the support layer 2 having the plural support lines 2a. In this case, if the island pattern is formed as an alignment mark, the mask sheet 13 has an aperture for the alignment mark in conformity with the island pattern.

Figure 13A:
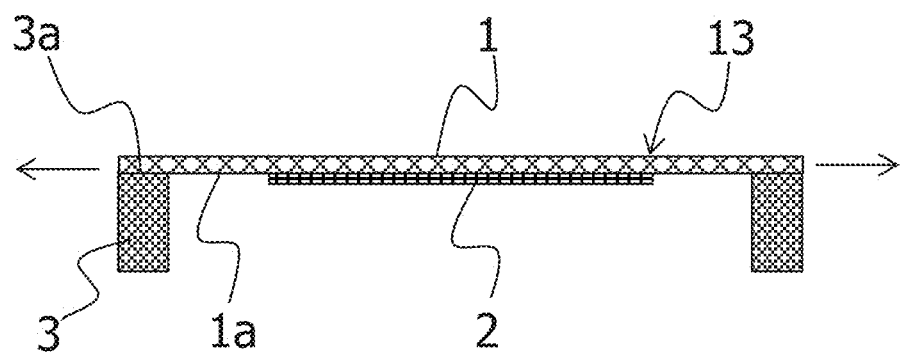
FIGS. 13A and 13B are an explanatory view showing a step of connecting a frame in the manufacturing method for a deposition mask according to the present invention.
Figure 13B:
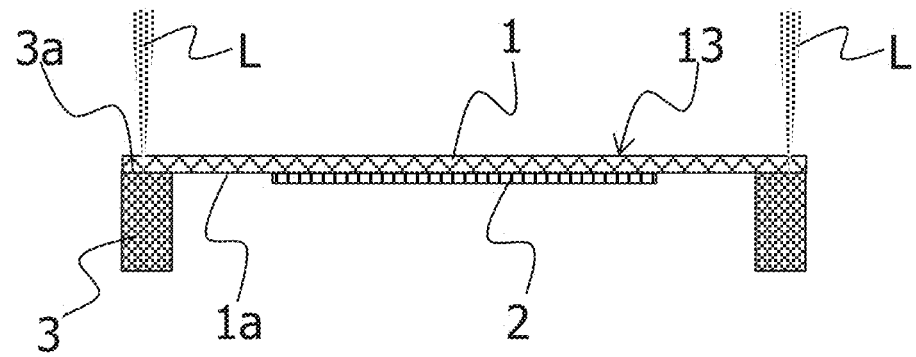

FIGS. 13A and 13B are explanatory views illustrating the third step, or a step of connecting the frame. First, as shown in FIG. 13A, the one surface 1a of the mask layer 1 having the support layer 2 formed thereon is faced toward the end surface 3a of the frame 3 and then the mask sheet 13 is stretched over the frame 3 by applying a predetermined tension sideways in parallel to the surface (as indicated by arrows of FIG. 13A).

Subsequently, as shown in FIG. 13B, the peripheral edge of the mask sheet 13 is irradiated with laser light L and then is spot-welded to the end surface 3a of the frame 3. At this point, the deposition mask of the present invention is completed.

Next, described is a manufacturing method for a touch panel using the deposition mask of the present invention. Conventional manufacturing methods for a touch panel include; a step of etching opposite sides of the display panel 5 with hydrofluoric acid to reduce its thickness and also polishing the surface to remove scratches that have deepened by etching; a step of forming, by sputtering, an ITO transparent conductive film on the entire display surface; a step of applying a photoresist onto the transparent conductive film and then exposing and developing the photoresist using a photomask to prepare a resist mask; and a step of etching the transparent conductive film using the resist mask to prepare a transparent electrode. These methods have a problem in that a manufacturing process is complicated and the running cost is high.

The touch panel requires neither high resolution nor high positional accuracy for the transparent electrode patterns. Thus, the touch panel of the present invention is prepared by etching opposite sides of the display panel 5 with hydrofluoric acid to reduce its thickness and then, forming a transparent conductive film by sputtering with the deposition mask of the present invention to directly form the transparent electrode on the display surface of the display panel 5.

Note that in the manufacturing method for the touch panel of the present invention, the scratches on the display surface of the display panel 5 do not adversely affect the formation of the transparent electrode at all, whereby the polishing step can be omitted, which is to remove the scratches on the surface that have deepened by etching. Accordingly, the manufacturing method for the touch panel of the present invention has an advantageous effect of simplifying the manufacturing process and saving the running cost compared to the conventional ones.

Hereinafter, the manufacturing method for the touch panel of the present invention, especially, the step of forming the transparent electrode is described in detail. First, the display panel 5 is placed and fixed, for example, to a substrate holder inside a vacuum chamber of a sputter deposition device. In this case, the display surface of the display panel 5 is faced toward an ITO sputtering target, and the magnet 14 is embedded into the substrate holder (see FIGS. 9A and 9B).

Meanwhile, the deposition mask of the present invention is placed and fixed to a mask holder of the sputter deposition device, with the mask layer 1 facing to the display panel 5.

Next, the display panel 5 and the deposition mask are placed face to face and aligned with each other, for example, by observing with an image pickup camera an alignment mark preformed on the display panel 5 and an alignment mark of the deposition mask, and aligning the two marks with each other.

Subsequently, utilizing the magnetic force of the magnet 14 embedded into the substrate holder, which can act on the magnetic metal material of the deposition mask, the deposition mask is attracted to thereby closely attach the mask layer 1 onto the display surface of the display panel 5.

After that, the cover of the vacuum chamber is closed to evacuate the chamber down to a predetermined vacuum degree. When the vacuum degree of the chamber reaches a desired value, a predetermined amount of noble gas such as argon (Ar) gas is introduced. Then, a high voltage is applied between the substrate holder and the target holder that holds the ITO sputtering target. As a result, a plasma is generated between the display panel 5 and the ITO sputtering target to induce sputter deposition for a transparent conductive film.

The argon gas ionized by plasma, that is, argon ions are attracted to the target to thereby collide with the target and sputter the target particles (ITO particles). The target particles then fly toward the display panel 5 and pass through a gap between the adjacent support lines 2a of the deposition mask and then, accumulate on the display surface of the display panel 5. As a result, the transparent conductive film is formed on the display surface of the display panel 5 in conformity with the aperture pattern 4 of the mask layer 1 to thereby obtain the transparent electrode of the touch panel. In this case, there is a gap between each support line 2a and the display surface of the display panel 5, with the same distance as the thickness of the mask layer 1, i.e., about 40 μm. Thus, the target particles still reach below the support lines 2a and accumulate on the display surface underneath the support lines 2a.

The transparent electrode is thinner at the portion below the support line 2a than the rest. Accordingly, shadows of the support lines 2a are made on the transparent electrode in accordance with the differences of deposition thickness. Hence, moire fringes or diffraction fringes may possibly appear on the display surface due to the shadows of the support lines 2a. According to the deposition mask of the present invention, the arrangement pitch for the support lines 2a is set so as to reduce at least moire fringes or diffraction fringes that appear due to the shadows of the support lines 2a, which are transferred onto the transparent electrode as unevenness in deposition thickness. Therefore, the moire fringes or diffraction fringes can be reduced, hereby improving the display quality of a display device equipped with the touch panel of the present invention.

In the above embodiment, the sputtering device forms a deposition layer without moving the substrate and the ITO sputtering target but can form a deposition layer while relatively moving the substrate and the ITO sputtering target. Moreover, the transparent conductive film can be prepared not only by sputter deposition but also by vacuum deposition or other such well-known deposition techniques. In addition, the transparent conductive film can be made of zinc oxide or tin oxide besides indium tin oxide (ITO).

Although in the above embodiment, the deposition mask is provided with the frame 3, the present invention is not limited thereto and the frame 3 can be omitted. In this case, the mask sheet 13 can be held onto the mask holder while a predetermined tension is applied sideways in parallel to the holding surface.

It should be noted that the entire contents of Japanese Patent Application No. 2014-140709, filed on Jul. 8, 2014, based on which convention priority is claimed herein, is incorporated herein by reference.

It should also be understood that many modifications and variations of the described embodiments of the invention will be apparent to a person having an ordinary skill in the art without departing from the spirit and scope of the present invention as claimed in the appended claims.

What is claimed is:

1. A deposition mask comprising:
    a mask layer provided with a plurality of aperture patterns, each of which is separated from each other by a rib and is formed in conformity with a deposition pattern to be formed on a substrate, wherein the plurality of aperture patterns have a same shape and size as the deposition pattern; and
    a support layer having a plurality of support lines formed on one surface of the mask layer across the plurality of aperture patterns,
    wherein the mask layer includes therein the rib and strip-shaped spacers that are provided inside the plurality of aperture patterns and configured to contact with a surface of the substrate to support the support lines of the support layer from below.

2. The deposition mask according to claim 1, wherein when the mask layer is aligned with the substrate, the support lines of the support layer intersect, at an angle of more than 0 degrees and less than 180 degrees, an array direction of a plurality of rectangular patterns that are arranged in line on the substrate.

3. The deposition mask according to claim 1, wherein the plurality of support lines of the support layer extend in one direction within a two-dimensional plane at an one surface of the mask layer.

4. The deposition mask according to claim 3, wherein the plurality of support lines of the support layer extending at different intervals are defined as a set, and a plurality of sets are arranged at a predetermined arrangement pitch.

5. The deposition mask according to claim 1, wherein the spacers have a strip-shaped longitudinal axis crossing the plurality of support lines of the support layer.

6. The deposition mask according to claim 1, wherein the mask layer and the support layer are formed by two-step electroplating processes with a magnetic metal material.

7. A method for manufacturing a deposition mask, the deposition mask comprising: a mask layer provided with a plurality of aperture patterns, each of which is separated from each other by a rib and is formed in conformity with a deposition pattern to be formed on a substrate, wherein the plurality of aperture patterns have a same shape and size as the deposition pattern; and a support layer having a plurality of support lines formed on one surface of the mask layer across the plurality of aperture patterns, wherein the mask layer includes therein the rib and strip-shaped spacers that are provided inside the plurality of aperture patterns and configured to contact with a surface of the substrate to support the support lines of the support layer from below, wherein the method comprises:
    a first step of forming, by electroplating, a magnetic metal mask layer on a metal base member to include in the magnetic metal mask layer the rib and the strip-shaped spaces, while forming the plurality of aperture patterns; and
    a second step of forming, by electroplating, a magnetic metal support layer, on one surface of the magnetic metal mask layer.

8. A touch panel comprising a transparent electrode that is prepared using a deposition mask, the deposition mask including: a mask layer provided with a plurality of aperture patterns, each of which is separated from each other by a rib and is formed in conformity with a deposition pattern to be formed on a substrate, wherein the plurality of aperture patterns have a same shape and size as the deposition pattern; and a support layer having a plurality of support lines formed on one surface of the mask layer across the plurality of aperture patterns, the mask layer including therein the rib and strip-shaped spacers that are provided inside the plurality of aperture patterns and configured to contact with a surface of the substrate to support the support lines of the support layer from below, and the transparent electrode being formed by deposition from a side of the support layer, on a display surface of a display element,
    wherein an arrangement pitch for the support lines is set so as to reduce moire fringes or diffraction fringes that appear due to shadows of the support lines, which are transferred onto the transparent electrode as unevenness in deposition thickness.

9. The touch panel according to claim 8, wherein the shadows of the support lines intersect, at an angle of more than 0 degrees and less than 180 degrees, an array direction of a plurality of pixel patterns that are arranged in line on the display element.

10. The touch panel according to claim 8, wherein the mask layer and the support layer of the deposition mask are prepared by two-step electroplating processes with a magnetic metal material, and the transparent electrode is formed in such a manner that the deposition mask is attracted to a magnet disposed on the opposite side to the display surface of the display element to thereby closely attach the mask layer onto the display surface.

\* \* \* \* \*